(12) United States Patent
Ohno

(10) Patent No.: US 6,489,815 B2
(45) Date of Patent: Dec. 3, 2002

(54) LOW-NOISE BUFFER CIRCUIT THAT SUPPRESSES CURRENT VARIATION

(75) Inventor: Tsuyoshi Ohno, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/839,119

(22) Filed: Apr. 23, 2001

(65) Prior Publication Data

US 2001/0035779 A1 Nov. 1, 2001

(30) Foreign Application Priority Data

Apr. 26, 2000 (JP) ........................................ 2000-125454

(51) Int. Cl.$^7$ ................................................. H03K 3/00
(52) U.S. Cl. ........................... 327/108; 327/437; 326/27
(58) Field of Search ........................ 327/108–112, 170, 327/434, 436, 437; 326/21, 27, 82, 83

(56) References Cited

U.S. PATENT DOCUMENTS

RE31,749 E * 11/1984 Yamashiro .................. 327/109
5,483,186 A * 1/1996 Miller et al. ................. 327/108

FOREIGN PATENT DOCUMENTS

| JP | 1-34016 | 2/1989 |
|---|---|---|
| JP | 1-165225 | 6/1989 |
| JP | 1-185022 | 7/1989 |
| JP | 2-220294 | 9/1990 |
| JP | 4-30389 | 2/1992 |

* cited by examiner

Primary Examiner—Kenneth B. Wells
(74) Attorney, Agent, or Firm—Young & Thompson

(57) ABSTRACT

A low-noise buffer circuit stabilizing the output voltage and current to prevent noise, includes current sources connected between the CMOS circuit and power supply sources providing a power supply for the CMOS circuit, a resistor element connected to the current sources and in parallel with the CMOS circuit, the resistor element bypassing current between the current sources to prevent current fluctuation.

18 Claims, 4 Drawing Sheets

LOW-NOISE BUFFER CIRCUIT THAT SUPPRESSES CURRENT VARIATION

BACKGROUND OF THE INVENTION

1. Field of the Invention

The present invention relates to a low-noise buffer circuit, and more particularly, to a low-noise buffer circuit which reduces noise, stabilizes output voltage and reduces variation of current flowing through itself.

2. Description of Related Art

Conventionally, as such low-noise buffer circuit, an output buffer for impedance matching in a transmission path, a CMOS circuit having a transistor serving as a high resistor connected to an inverter are known. These buffer circuits are provided for suppressing a peak current (the maximum current upon occurrence of a change in input). These buffer circuits are grouped into two types. One type is circuits to feed a short circuit current through a CMOS circuit and the other type is circuits without short circuit current.

The former type circuits include a circuit using a termination resistor and a circuit in a sense amplifier driving circuit of semiconductor memory as disclosed in Japanese Kokai No. Hei 4-30389 where a gate of a driving transistor is provided with voltage lower than a threshold voltage of the transistor so that the transistor is gradually turned on. Besides, a circuit in an output driver circuit as disclosed in Japanese Kokai No. Hei 1-165225 has a transistor to function as a high resistor or week current power supply connected to an inverter.

On the other hand, the latter circuits include an output driver as disclosed in Japanese Kokai No. Hei 134016 having a circuit where the occurrence of short circuit current is completely prevented by first operating a transistor which takes an off state from an on state, and a circuit where the short circuit current is eliminated by shifting operation timing of charged/discharged transistor to reduce the peak current. Besides, a circuit as disclosed in Japanese Kokai No. Hei 2-220294 has a precharge circuit that is controlled by a signal corresponding to an output signal level and prevents occurrence of short circuit current, so as to enable high-speed reading or to reduce the peak current, and a circuit as disclosed in Japanese Kokai No. Hei 1185022 eliminates the short circuit current by controlling the operation timing with inverters having different logical thresholds.

In any case, the conventional buffer circuits feed or eliminate the short circuit current to suppress the peak current. In a CMOS inverter, if noise due to operation switching is to be reduced, the short circuit current is fed while sacrificing current consumption to a degree. On the other hand, if reduction of the current consumption occupies a higher priority than the reduction of the noise, the short circuit current is eliminated while sacrificing occurrence of noise due to impedance mismatch in a transmission path or switching noise.

FIG. 5 is a diagram of a prior art buffer circuit where an output side is terminated. As shown in FIG. 5, the buffer circuit has a CMOS inverter circuit 2 comprising a PMOS transistor 21 and an NMOS transistor 22 with respective gates connected to an input terminal 11. A source of the PMOS transistor 21 is connected to a power supply VDD, and a source of the NMOS transistor 22 is connected to the ground GND. Both drains are connected to an output terminal 12. The output terminal 12 supplies a predetermined voltage VDD/2 via a transmission line 5 and a termination resistor R.

In this case, a current is constantly flowed through the transmission path 5 and the termination resistor R via the PMOS transistor 21 or the NMOS transistor 22 of the CMOS circuit 2, and reflection noise is suppressed by obtaining impedance matching in the transmission path while sacrificing such constant current.

FIG. 6 is a diagram of AC operation characteristics representing respective levels of input/output voltages and currents in the CMOS circuit in FIG. 5. The vertical axis represents potential and current, and the horizontal axis represents time. In FIG. 6, VIN denotes an input voltage applied to the input terminal 11; VOUT, an output voltage which appears in the output terminal 12 upon application of the input voltage VIN; IV, a current which flows from the power supply VDD via the PMOS transistor 21 and via the output terminal 12 and the NMOS transistor 22 through the VDD/2; IG, a current which flows from the output terminal 12 via the NMOS transistor 22 and from the power supply VDD/2 via the PMOS transistor 21 through the GND.

Accordingly, a whisker-like variation occurs in the currents IV and IG when the power supply is turned on (time: 0.0 nS) and upon inversion of the CMOS circuit 2 (approximately 22.0 nS). Further, in case of output buffer having a termination resistor, the maximum current variation (p-p) is 17.5 mA, and the through rate of output waveform is 1.0 V/nS.

In the above-described Japanese Kokai No. Hei 1-165225, a high resistor and a weak current power supply are connected between the CMOS circuit 2 and the power supply VDD and the GND to suppress such noise and short circuit current upon inversion of the inverter.

As above-described, the related low-noise buffer circuits suppresses reflection noise by sacrificing constantly-flowing current and switching noise by connecting high-resistor to a weak current power supply.

That is, in interface techniques in recent years represented by an output buffer having a termination resistor, a low-amplitude signal is obtained by divided voltage by the termination resistor. For this purpose, such interface has a high power-supply voltage in consideration of divided voltage. That is, the interface increases a voltage to a high voltage and then reduces the voltage (to a low-amplitude). However, such repetition of voltage increase/decrease lowers circuit efficiency. Further, in acquisition of high-speed operation in a buffer which forms an interface in recent years, to reduce noise due to impedance mismatch in a transmission path, the buffer usually has a termination resistor. In such case, a large constant current by the termination resistor occurs, and the current greatly varies upon switching.

More particularly, in recent interface techniques, a bus width increases and the number of operations increases. Accordingly, in high-speed operation, simultaneous operation timings are further concentrated, so that simultaneous operation noise increases. Further, a large constant current which occurs by a termination resistor connected to an output terminal varies upon switching operation, and noise caused by the current increases.

Accordingly, in the related buffer circuits, as a countermeasure for the increase in simultaneous operation noise and delay variation due to the simultaneous operation noise, or in use of termination resistor, a large constant current varies upon switching, which increases radiation noise.

SUMMARY OF THE INVENTION

An object of the present invention is to provide a low-noise buffer circuit which suppress such noises as described above.

Another object of the present invention is to provide a low-noise buffer circuit which suppresses a variation of current, whereby noise can be reduced.

A low-noise buffer circuit according to the present invention includes a first circuit having an input terminal provided with an input signal, an output terminal supplying an output signal, and first and second terminals; a first current source connected between a first potential source and the first terminal; a the current source connected between a second potential source and the second; and a first component serving as a resistor and connected between the first and second current sources in parallel to the first circuit.

These and other objects of the present invention will be apparent to those of skill in the art from the appended claims when read in light of the following specification and accompanying figures.

DETAILED DESCRIPTION OF THE PREFERRED EMBODIMENTS

Figure 1A:
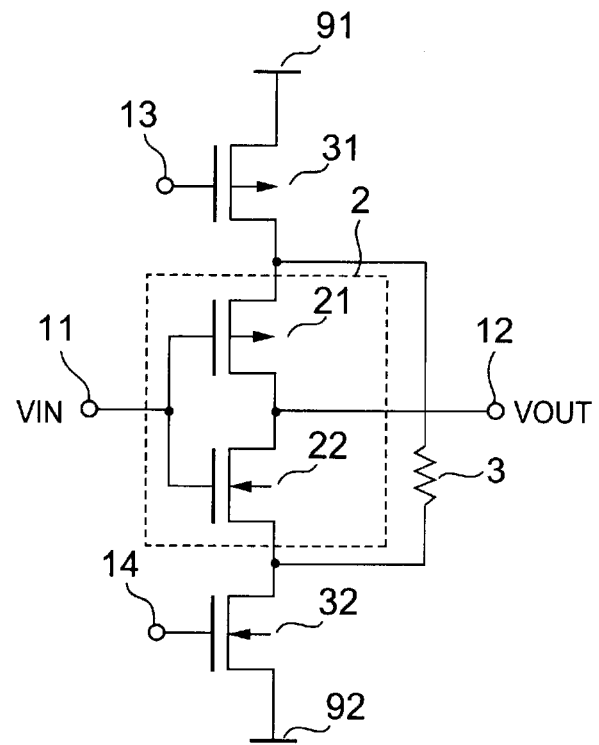
FIG. 1A is a diagram of low-noise buffer circuit showing the first embodiment of the present invention.
Figure 1B:
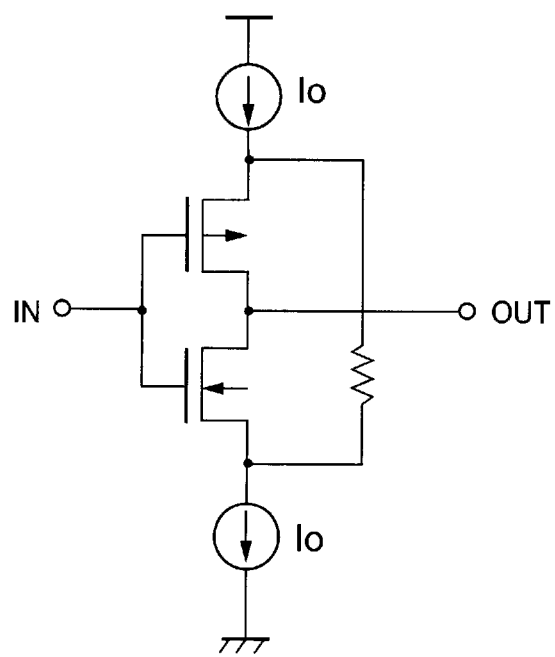
FIG. 1B is an equivalent circuit diagram of low-noise buffer circuit shown in FIG. 1A.

FIGS. 1A and 1B are diagrams of low-noise buffer circuit showing a first embodiment of the present invention and its equivalent circuit diagram. As shown in FIGS. 1A and 1B, in the present embodiment, in a CMOS semiconductor integrated circuit, constant-current power supplies are respectively provided between the CMOS circuit 2 and the power supply side such as a VCC, the ground, and a resistor device 3 is provided in parallel to the CMOS circuit 2.

That is, as shown in FIGS. 1A and 1B, the CMOS circuit 2 comprises the PMOS 21 and the NMOS 22, the input terminal 11 connected to the gates of the PMOS 21 and the NMOS 22, and the output terminal 12 connected to the both drains. Further, a PMOS 31 as a current power supply with its gate controlled from a driving terminal 13 is connected between the CMOS circuit 2 and a potential supply source (e.g., VCC) 91, and similarly, an NMOS 32 as a current power supply of the same supply performance as that of the PMOS 31, with its gate controlled from a driving terminal 14, is connected between the CMOS circuit 2 and a potential supply source (e.g., ground) 92. The resistor device 3 is connected in parallel to the CMOS circuit 2. The resistor device 3 has a resistance value equal to that when the CMOS circuit 2 is turned ON. The resistor device bypasses the current through the current power supplies 31, 32 in accordance with a resistance variation of the CMOS circuit 2.

As the above resistor device 3 is provided, the CMOS circuit 2 operates without variation of input and output currents upon switching in the CMOS circuit 2.

The inverter circuit will be described as an example of general CMOS circuit 2. The circuit is constructed with a PMOS transistor and an NMOS transistor, an input terminal connected with gates and output terminal connected to drains. The operation of the inverter has in three states in accordance with an input potential: state 1 where the PMOS transistor is ON while the NMOS transistor is OFF, state 2 where the both transistors are ON, and state 3 where the PMOS transistor is OFF while the NMOS transistor is ON. In the states 1 and 3, since the PMOS transistor or the NMOS transistor is OFF, the current does not flow between the power supplies. On the other hand, in the state 2, since the both transistors are ON, the current flows between the power supplies. That is, if the state changes from state 1 to state 2 or from state 2 to state 3 in accordance with the input potential, the current greatly increases.

On the other hand, in the present embodiment, the current power supplies comprises the MOS transistors 31 and 32 which are used in MOS-transistor saturation area. As a basic characteristic of such MOS transistor, a drain current (Ids) vs drain-source voltage (Vds) characteristic is known. In saturation area, despite variation of the Vds a constant current. In this saturation area, the range of Vds as a constant-current power supply differs depending on gate voltage Vgs. In this present embodiment, it is significant that the transistor can serve as a constant-current power supply while Vds ranges from half of potential supply voltage to potential supply voltage.

In a case where current power supplies hold the CMOS circuit 2 therebetween, i.e., in a case where the CMOS circuit 2 in which the current varies is held between constant-current power supplies having the same current supply performance, in the state 2, the circuit operates at a constant current, however, in the states 1 and 3, since the part of the CMOS 2 is open, the amount of current is reduced. That is, the amount of current between the potential supply sources changes in correspondence with an input potential providing for input terminal 11.

Then, in the present embodiment, the resistor device 3 is connected in parallel, so as to obtain a constant current between the potential supply sources in any of the states. In the state 1 and the state 3, as the CMOS circuit 2 is in an open-like status, a current $I_0$ controlled by the current power supply flows through the resistor device 3. In the state 2, the constant current $I_0$ flows through the resistor device 3 and the CMOS circuit 2 connected in parallel. That is, the current that flows through the resistor device 3 corresponds to the current to be bypassed in accordance with state.

Figure 2:
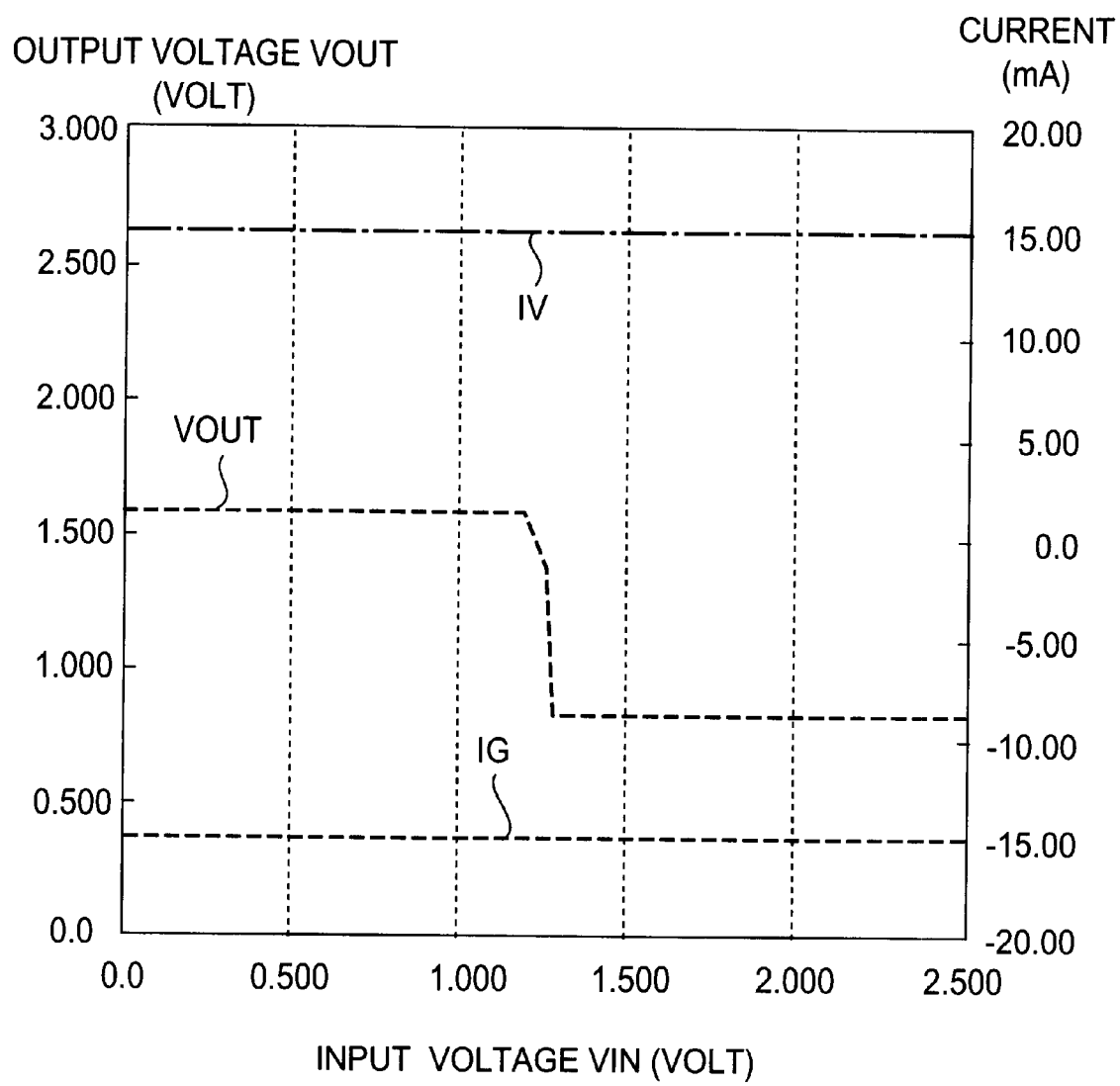
FIG. 2 is a diagram of input/output characteristics of the circuit shown in FIG. 1.

FIG. 2 is a diagram of input/output characteristics in the CMOS circuit shown in FIG. 1. As shown in FIG. 2, VIN denotes an input voltage; VOUT, an output voltage; IV, a current on the power supply side; and IG, a current on the GND side. According to the present embodiment, as it is apparent from the input/output characteristics, in currents IV and IG, a characteristic without current variation can be realized.

Figure 3:
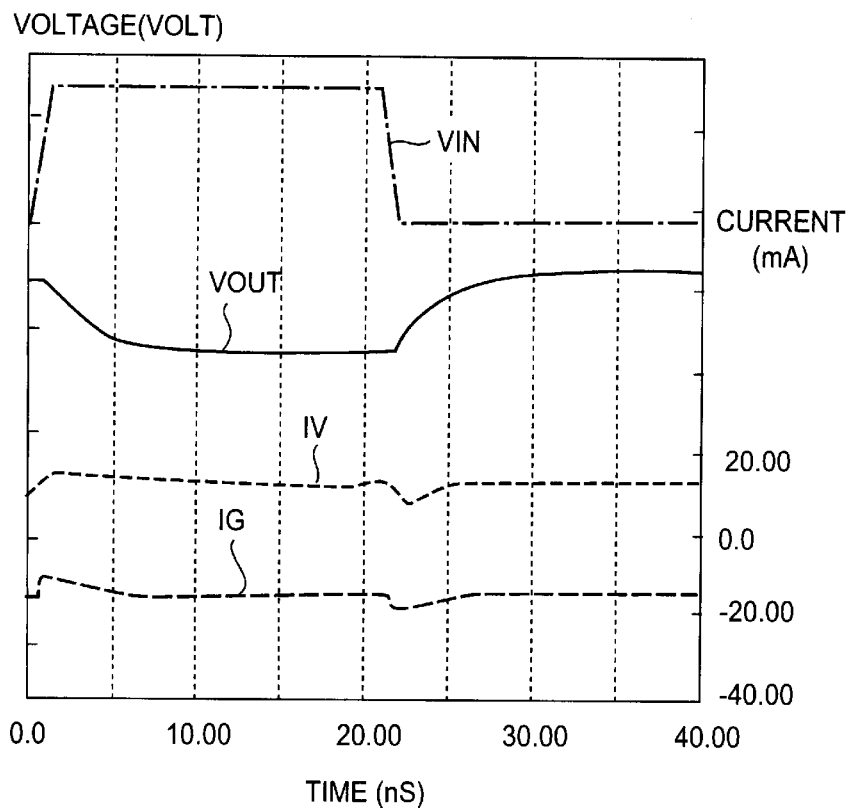
FIG. 3 is a diagram of AC operation characteristics representing the respective levels of the input/output voltages and currents of the circuit shown in FIG. 1.

Further, FIG. 3 is a diagram of AC operation characteristics representing input/output voltages and currents in the CMOS circuit in FIG. 1. As shown in FIG. 3, in these level characteristics, VI denotes an input voltage applied to the input terminal 11; VOUT, an output voltage which appears in the output terminal 12 upon application of the input voltage VIN; IV, a current which flows from the power supply VDD via the PMOS transistor 21 and via the output terminal 12 and the NMOS transistor 22 through the GND; and IG, a current which flows from the output terminal 12 via the NMOS transistor 22 and from the power supply VDD via the PMOS transistor 21 through the GND.

Accordingly, the horizontal axis represents time, the noise that occurs in the currents IV and IG when the power supply is turned on (time: 0.0 nS) and upon inversion of the CMOS circuit 2 (approximately 22.0 nS) can be suppressed.

Figure 6:
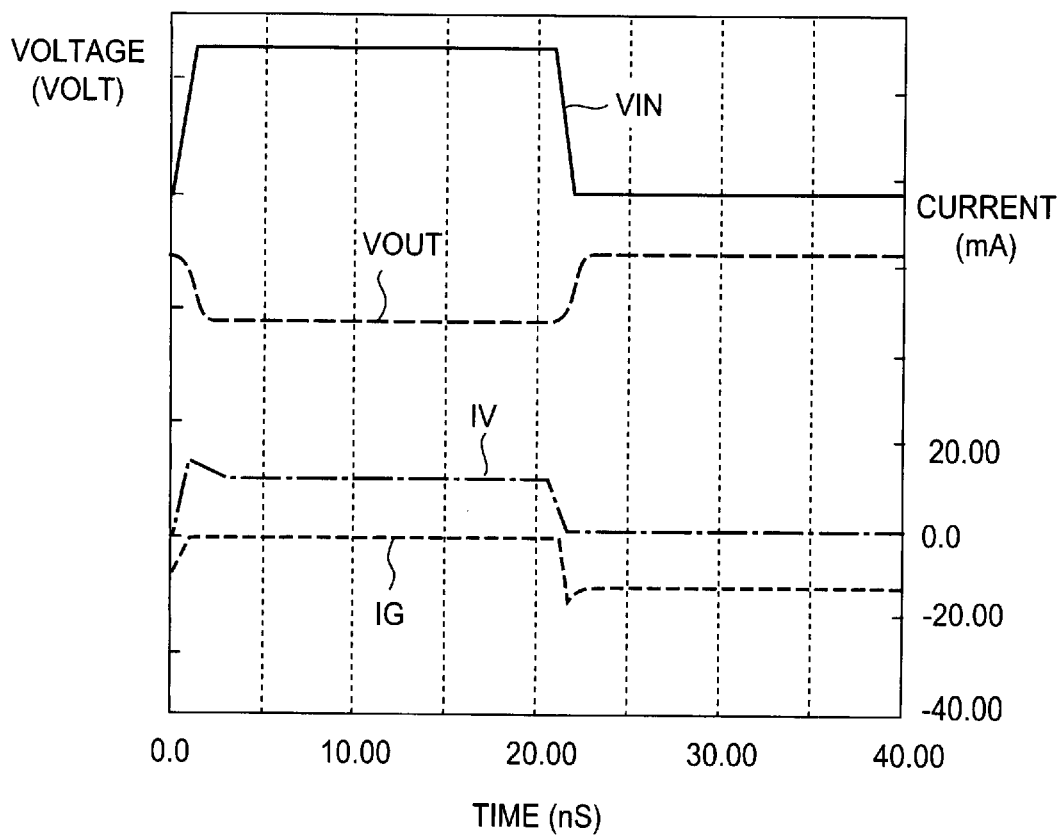
FIG. 6 is a diagram of AC operation characteristics representing the respective levels of the input/output voltages and currents of the circuit shown in FIG. 5.

Note that in case of output buffer having a termination resistor, the maximum current variation (p-p) is 3.7 mA, and the through rate of output waveform is 0.35 V/nS. In comparison with the above related art in FIG. 6, the maximum current variation is reduced by 80%, and the through rate of output waveform is improved by 2.8 times.

Figure 4:
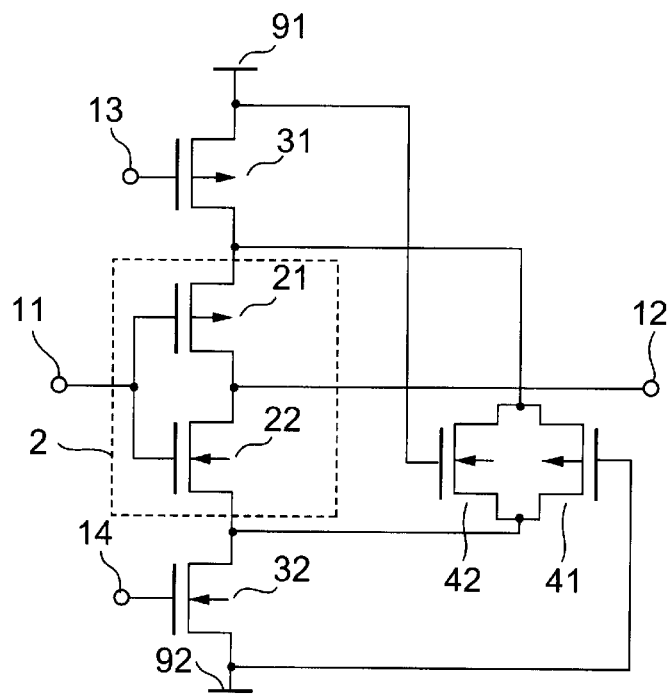
FIG. 4 is a diagram of low-noise buffer circuit showing the second embodiment of the present invention.
Figure 5:
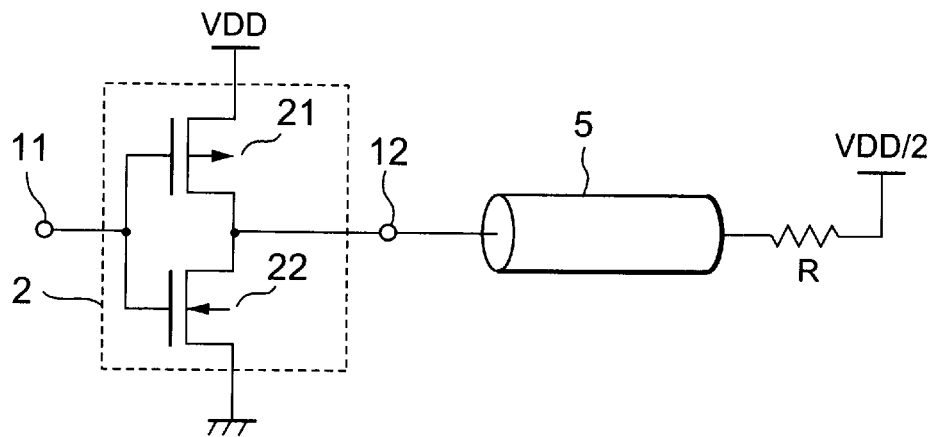
FIG. 5 is a diagram of a prior art buffer circuit with termination resistor.

FIG. 4 is a diagram of low-noise buffer circuit showing a second embodiment of the present invention. As shown in FIG. 4, the present embodiment has the CMOS circuit 2 comprising the PMOS transistor 21 and the NMOS transistor 22 where the input terminal 11 is connected to respective gates and the output terminal 12 connected to the both drains, the PMOS transistor 31 as a constant-current power supply connected between the power supply VDD and the source of the PMOS transistor 21 of the CMOS circuit 2, the NMOS transistor 32 as a constant-current power supply connected between the GND and the source of the NMOS transistor 22 of the CMOS circuit 2, and a PMOS transistor 41 and an NMOS transistor 42 connected between these PMOS transistor 31 and NMOS transistor 32 in parallel to the CMOS circuit 2, with respective gates connected to the GND and the power supply VDD.

The major difference in the circuit diagram shown in FIG. 4 from that shown in FIG. 1A is that the PMOS transistor 41 and the NMOS transistor 42 whose gates are supplied with the GND and the power supply VDD, respectively. This technique can be used in circuits which require noise reduction and high-speed operation in the semiconductor field.

The CMOS circuit 2 in the above-described embodiments has been explained as in an inverter as an example. However, the CMOS circuit 2 can be applied to all the circuits where a resistance value varies including other logic circuits such as NAND and NOR as well as the inverter.

As described above, the low-noise buffer circuit of the present invention suppresses current variation due to switching between the potential supply sources and reduces noise by providing the constant-current power sources between the CMOS circuit, and the power supply and the GND, and connecting the resistor device in parallel to the CMOS circuit.

Further, in the present invention, delay value variation due to self-generating noise can be suppressed even if plural buffers operate simultaneously.

Further, according to the present invention, for high-speed operation, an output buffer circuit narrowing amplitude of an output voltage can use a pre-stage circuit without a voltage booster, so that high-speed operation of the pre-stage circuit can be realized. In case the prestage circuit has the same delay time as the related circuit has, operation of the pre-stage circuit has a margin of time and the pre-stage circuit can afford to help low slew rate of output waveform. Furthermore, in case the 3 state (Low, High, High-Z) logic circuit is used as the output buffer, the 3 state logic can be realized by using the constant-current power supply which does not influence the delay time in the pre-stage circuit. Accordingly, high-speed operation can be realized.

While preferred embodiments of the present invention have been described, it is to be understood that the invention is to be defined by the appended claims when read in light of the specification and when accorded their full range of equivalents.

What is claimed is:

1. A low-noise buffer circuit, comprising:
   a first circuit having four terminals, namely an input signal terminal, an output terminal for supplying an output signal, and first and second terminals that are each different from said input signal terminal and said output terminal;
   a first current source connected between a first potential source and said first terminal;
   a second current source connected between a second potential source and said second terminal; and
   a first component serving as a resistor and connected between said first and second current sources in parallel to said first circuit.

2. The low noise buffer circuit according to claim 1, wherein said first and second current source have the same current supply power.

3. The low noise buffer circuit according to claim 1, wherein said first and second current sources comprise activated first and second transistors configured for operation in the saturation region.

4. The low noise buffer circuit according to claim 3, wherein said first transistor includes a PMOS transistor and said second transistor includes an NMOS transistor.

5. The low noise buffer circuit according to claim 1, wherein said first potential source is a power supply source and said second potential source is a ground.

6. The low noise buffer circuit according to claim 1, wherein said first component is a resistor.

7. The low noise buffer circuit according to claim 1, wherein said first component has a resistance value which is the same resistance value represented by said first circuit when current flows through said first circuit.

8. The low noise buffer circuit according to claim 1, wherein said first component includes first and second transistors, said first transistor having a first gate connected to said first potential source and a first source-drain path connected between said first and second current sources in parallel to said first circuit, and said second transistor having a second gate connected to said second potential source and a second source-drain path connected to between said first and second current sources.

9. The low noise buffer circuit according to claim 1, wherein said first component comprises an activated transmission gate.

10. The low noise buffer circuit according to claim 1, wherein said first circuit includes CMOS transistors.

11. The low noise buffer circuit according to claim 1, wherein said first circuit is a CMOS inverter circuit.

12. The low noise buffer circuit according to claim 1, wherein said first circuit includes PMOS and NMOS transistors connected in series between said first and second terminals, gates of said PMOS and NMOS transistors connected to said input terminal, and drains of said PMOS and NMOS transistors connected to said output terminal.

13. A low noise buffer circuit, comprising:
   a first transistor having a first gate, a first drain and a first source;
   a second transistor having a second gate connected to said first gate, a second drain connected to said first drain and a second source;
   first and second potential sources;
   a first current source connected between said first source and said first potential source;
   a second current source connected between said second source and said second potential source;

a resistor connected between said first and second source in parallel with said first and second transistors.

14. The low noise buffer circuit according to claim 13, wherein each of said first and second transistors includes a MOS transistor.

15. The low noise buffer circuit according to claim 13, wherein said first potential source is a power supply and said second potential source is a ground.

16. The low noise buffer circuit according to claim 13, wherein each of said first and second current sources include a MOS transistor.

17. A low noise buffer circuit, comprising:

a first transistor having a first gate connected to an input terminal, a first drain connected to an output terminal, and a first source;

a second transistor having a second gate connected to said input terminal, a second drain connected to said output terminal, and a second source;

first and second potential sources;

a first current source connected between said first source and said first potential source;

a second current source connected between said second source and said second potential source;

a third transistor connected between said first and second current sources in parallel to said first and second transistors and having a third gate connected to said first potential source;

a fourth transistor connected between said first and second current sources in parallel to said first and second transistors and having a fourth gate connected to said second potential source.

18. The low noise buffer circuit according to claim 17, wherein said first potential source is a power supply and said second potential source is a ground.

* * * * *